(12) United States Patent
Ridley et al.

(10) Patent No.: US 7,396,476 B2
(45) Date of Patent: Jul. 8, 2008

(54) METHOD FOR REDUCING HARMONIC DISTORTION IN COMB DRIVE DEVICES

(75) Inventors: Jeffrey A. Ridley, Shorewood, MN (US); James A. Neus, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 212 days.

(21) Appl. No.: 11/275,575

(22) Filed: Jan. 17, 2006

(65) Prior Publication Data

US 2006/0113644 A1    Jun. 1, 2006

Related U.S. Application Data

(62) Division of application No. 10/746,219, filed on Dec. 22, 2003, now Pat. No. 7,012,322.

(51) Int. Cl.
*C23F 1/00* (2006.01)

(52) U.S. Cl. .............. 216/2; 216/37; 438/39; 438/40; 438/48; 438/52; 438/456; 257/673; 257/678; 359/298; 359/291; 359/328

(58) Field of Classification Search ........ 216/2; 438/39; 257/673
See application file for complete search history.

(56) References Cited

U.S. PATENT DOCUMENTS

| | | | |
|---|---|---|---|
| 5,969,848 A * | 10/1999 | Lee et al. ........ | 359/298 |
| 6,143,583 A | 11/2000 | Hays | |
| 6,363,183 B1 | 3/2002 | Koh | |
| 6,544,655 B1 * | 4/2003 | Cabuz et al. ........ | 428/446 |
| 6,582,985 B2 * | 6/2003 | Cabuz et al. ........ | 438/48 |
| 6,995,067 B2 * | 2/2006 | Boyd et al. ........ | 438/308 |
| 2002/0178817 A1 | 12/2002 | Selvakumar et al. | |
| 2003/0117038 A1 | 6/2003 | Marxer | |

FOREIGN PATENT DOCUMENTS

WO    WO0219509    3/2002

OTHER PUBLICATIONS

Gianchandani et al., "Micron-Sized, High Aspect Ratio Bulk Silicon Micromechanical Devices," IEEE Robotics and Automation Society, Micro Electro Mechanical Systems, '92, Travemunde Germany, Feb. 4-7, 1992 pp. 208-213.

(Continued)

*Primary Examiner*—Duy-Vu Deo
*Assistant Examiner*—Maki Angadi (57) ABSTRACT

Methods of fabricating comb drive devices utilizing one or more sacrificial etch-buffers are disclosed. An illustrative fabrication method may include the steps of etching a pattern onto a wafer substrate defining one or more comb drive elements and sacrificial etch-buffers, liberating and removing one or more sacrificial etch-buffers prior to wafer bonding, bonding the etched wafer substrate to an underlying support substrate, and etching away the wafer substrate. In some embodiments, the sacrificial etch-buffers are removed after bonding the wafer to the support substrate. The sacrificial etch-buffers can be provided at one or more selective regions to provide greater uniformity in etch rate during etching. A comb drive device in accordance with an illustrative embodiment can include a number of interdigitated comb fingers each having a more uniform profile along their length and/or at their ends, producing less harmonic distortion during operation.

22 Claims, 6 Drawing Sheets

OTHER PUBLICATIONS

Gianchandani et al., "Silicon Micromachined Thermal Profilers," IEEE Electron Devices Society, International Electron Devices Meeting, Washington, DC, Dec. 5-8, 1993, pp. 8.5.1-8.5.4.

Gianchandani et al., "A Bulk Silicon Dissolved Wafer Process For Microelectromechanical Systems," International Electron Devices Meeting, Washington, DC, Dec. 8-11, 1991, pp. 29.5.1-29.5.4.

Gianchandani et al., "A Bulk Silicon Dissolved Wafer Process for Microelectromechanical Devices," Journal of Microelectromechanical Systems, vol. 1, No. 2, Jun. 1992, pp. 77-85.

Lee, Y.H., et al., "Feature-Size Dependence of Etch Rate in Reactive Ion Etching," Journal of Electromechanical Society, vol. 138, No. 8, Aug. 1991, pp. 2439-2445.

* cited by examiner

METHOD FOR REDUCING HARMONIC DISTORTION IN COMB DRIVE DEVICES

The present application is a divisional of U.S. application Ser. No. 10/746,219, filed Dec. 22, 2003 now U.S. Pat. No. 7,012,322, entitled "METHOD FOR REDUCING HARMONIC DISTORTION IN COMB DRIVE DEVICES", the disclosure of which is hereby incorporated by reference.

This invention was made with government support under Government Contract No. F33615-01-3-5705 awarded by the Department of the Air Force. The government may have certain rights in the invention.

FIELD OF THE INVENTION

The present invention relates generally to the field of semiconductor manufacturing and microelectromechanical systems (MEMS). More specifically, the present invention pertains to fabrication methods for reducing harmonic distortion in comb drive devices.

BACKGROUND OF THE INVENTION

Electrostatic comb drive devices are utilized to provide movement or motion in microelectromechanical systems (MEMS) devices. Such drive devices are employed, for example, in the fabrication of MEMS-type accelerometers, gyroscopes, and inertia sensing devices where rapid actuation is often necessary to effectively measure and/or detect motion and acceleration.

In a typical comb drive device, a main body is supported over an underlying support substrate using a number of anchors. One or more drive elements electrically coupled to the main body can be actuated to manipulate the main body above the support substrate in a particular manner. In certain designs, for example, the drive elements may include a number of interdigitated comb fingers configured to convert electrical energy into mechanical energy using electrostatic actuation.

One method of fabrication of electrostatic comb drive devices generally begins with a silicon wafer substrate. A highly boron-doped layer is realized through diffusion or epitaxial growth over the wafer substrate, which can then be etched to form the desired microstructures using a patterned mask layer and a suitable etch process, such as the Bosch-type Deep Reactive Ion Etch (DRIE). The etched wafer is then bonded to an underlying support substrate using a suitable bonding process such as anodic bonding. The support substrate may include a number of mesas that support the main body and drive elements above the support substrate while allowing movement thereon, and metal patterns appropriate for connecting to the silicon members. One or more electrodes can also be provided on the support substrate to measure up/down movement of the main body caused by, for example, acceleration or rotation of the sensor. The silicon substrate wafer is then removed through one or more non-selective and selective etch processes, such as KOH and EDP based etching, leaving only the patterned, highly doped silicon structure.

For the force of the comb drive to be applied uniformly as the device moves back and forth, the shape or profile of the etched structure should be as uniform as possible. The uniformity of the etched structure is dependent on a number of factors including, for example, the gap between adjacent features, and the parameters of the DRIE process used. Since etching tends to be slower at those locations where there are relatively small gaps between adjacent features, the profile of the comb fingers tend to be non-uniform along their length, due to the varying gap sizes caused by the partial overlap of the comb fingers. This non-uniformity may result in changes in capacitance as the comb fingers move with respect to each other, producing undesired electrical harmonics in the motor drive power. These additional harmonics can reduce the desired motive force of the comb fingers, resulting in greater energy dissipation and noise in the sensor output. In some cases, the non-linear profile of the comb fingers may produce quadrature, or motion out-of-plane, which further creates noise in the sensor output. As such, there is a need in the art for improved fabrication methods for reducing harmonic distortion in comb drive devices.

SUMMARY OF THE INVENTION

The present invention relates to fabrication methods for reducing harmonic distortion in comb drive devices. In an illustrative method of the present invention, an epitaxial layer of, for example, highly boron-doped (p++) silicon or other suitable material can be grown or formed on the surface of a wafer substrate used to form an electrostatic comb drive device. A patterned mask layer defining a number of comb drive elements and one or more sacrificial etch-buffers can be formed on the p++ layer. Etch-buffers can be employed to make the gap between adjacent features more uniform. These etch-buffers can be used at or near those locations where producing a uniform etched profile is desirable. In some cases, the etch-buffers can be relatively small in size, such as when positioned between adjacent fingers of a comb drive structure. In other cases, the etch-buffers can be larger in size, such as when it is also desirable to fill in area that does not need to be etched. The pattern can be etched into the p++ layer and through to the underlying substrate.

In some cases, the relatively small etch-buffers that are placed between adjacent fingers of a comb drive structure may be difficult to remove during final wafer dissolution. Therefore, and in accordance with some embodiments of the present invention, the relatively small etch-buffers are removed before wafer bonding, but this is not required. Thus, and in some illustrative embodiments, after patterning the p++ layer, the wafer may be immersed in a suitable etchant, such as EDP, and the relatively small etch-buffers are fully undercut and liberated through, for example, a combination of etching, rinsing and cleaning. Because of their size, only the relatively small etch-buffers are fully undercut, and all of the desired features, as well as any larger etch-buffers if present, remain attached to the silicon substrate.

The top of the etched wafer substrate can be bonded to an underlying support substrate, using a suitable bonding process such as anodic bonding. Once bonded to the support substrate, a final backside etching process may be performed to remove the remaining wafer substrate, using the boron-doped silicon layer as an etch stop. When the relatively small etch-buffers are not removed before wafer bonding, the final backside etching process will liberate the etch-buffers. In some cases, a combination of rinsing and cleaning may be used to help remove the etch-buffers from the resulting structure.

When employed, the sacrificial etch-buffers may act to reduce or eliminate the relatively large gaps between non-overlapping regions of the comb drive fingers. The etch-buffers can be formed at selective regions on the wafer substrate to ensure a relatively uniform etch rate along the length and/or at the ends of the comb fingers. In certain embodiments, for example, the sacrificial etch-buffers can be used to provide a uniform gap between the sides of adjacent comb fingers. During etching, this uniform gap may reduce differences in etch rates that can occur along the length of the comb fingers, thus providing a more uniform profile to the comb fingers. As a result, the capacitive force induced as the comb fingers move with respect to each other tends to be more linear, which may substantially reduce the introduction of electrical harmonics into the drive system.

DETAILED DESCRIPTION OF THE INVENTION

The following description should be read with reference to the drawings, in which like elements in different drawings are numbered in like fashion. The drawings, which are not necessarily to scale, depict selected embodiments and are not intended to limit the scope of the invention. Although examples of construction, dimensions, and materials are illustrated for the various elements, those skilled in the art will recognize that many of the examples provided have suitable alternatives that may be utilized.

Figure 1:
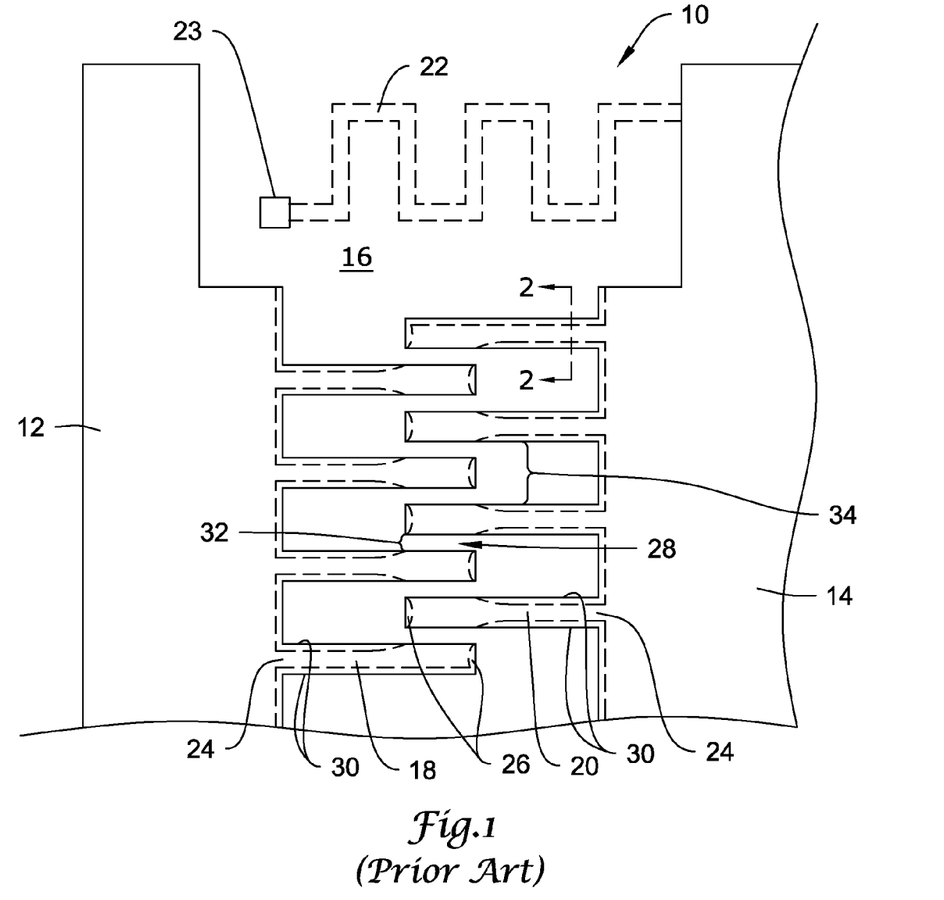
FIG. 1 is a schematic view of an illustrative prior art electrostatic comb drive device including a number of comb drive elements having a non-uniform profile.

FIG. 1 is a schematic view of an illustrative prior art electrostatic comb drive device 10 including a number of comb drive elements having a non-uniform profile. Comb drive device 10, illustratively a linear comb drive device, includes first and second comb drive members 12,14 each formed in an opposing manner over a glass support substrate 16. While a glass support substrate 16 is used, it is contemplated that the support substrate 16 may be made from any suitable material or material system.

The first comb drive member 12 includes a number of comb fingers 18 that are interdigitated with a number of comb fingers 20 coupled to the second comb drive member 14. In the particular view depicted in FIG. 1, only a portion of the first and second drive members 12,14 are shown for sake of clarity. It should be understood, however, that other components, in addition to those specifically discussed herein, may be disposed on or above the support substrate 16.

During electrostatic actuation, the first comb drive member 12 is configured to remain stationary above the support substrate 16. The second comb drive member 14, in turn, is freely suspended above the support substrate 16, and is configured to move back and forth relative to the first comb drive member 12. A suspended spring 22 may be provided between the second comb drive member 14 and an anchor 23, where the anchor is fixed to the support substrate 16. The suspended spring 22 provides a restoring force to the second comb drive member 14 when the drive voltage passes through zero.

An external AC voltage source (not shown) having leads connected to the first and second comb drive members 12,14 can be configured to deliver a charge to the first and second comb fingers 18,20, inducing motion therebetween. The voltage source can be configured to output a time-varying voltage signal to alternate the charge delivered to the comb fingers 18,20, which in conjunction with the suspended spring 22, causes the second drive member 14 to oscillate back and forth in a particular manner relative to the first comb drive member 12.

As can be further seen in FIG. 1, each comb finger 18,20 extends longitudinally from a base portion 24 to an end portion 26 thereof. In the illustrative prior art electrostatic comb drive device depicted in FIG. 1, the comb fingers 18,20 are aligned in a parallel manner, and are configured to move longitudinally relative to each other when energized by the AC voltage source. An overlapping region 28 disposed between the sides 30 of each laterally adjacent comb finger 18,20 forms a relatively small gap 32 that is sufficiently small (e.g. 1 to 2 microns wide) to induce a sufficient capacitance between the comb fingers 18,20. A relatively large gap 34 (e.g. 7 to 9 microns wide), in turn, separates the non-overlapping regions between each comb finger 18,20. During actuation, movement of the second comb fingers 20 relative to the first comb fingers 18 causes the amount of overlap at the overlapping region 28 to change over time. The relatively small gap 32 between each laterally adjacent comb finger 18,20 remains constant, however, based on the longitudinal arrangement of the comb fingers 18,20.

Fabrication of the prior art electrostatic comb drive device is typically accomplished using a silicon wafer substrate that is etched to form the desired drive elements, and then bonded to the underlying support substrate 16 by anodic bonding, adhesive, or other suitable bonding method. The gaps 32,34 separating the various comb fingers 18,20 are typically formed with a plasma etch tool configured to run a Bosch-type gas-switching Deep Reactive Ion Etch process (DRIE).

The efficacy of the DRIE process to form comb drive elements having a uniform profile is dependent in part on the etch rate of the DRIE process. The etch rate is typically optimized to provide a uniform profile along the smallest gap 32 between comb fingers 18,20. As indicated by the dotted lines in FIG. 1, for example, an increased amount of lateral etching typically occurs along the sides 30 of the comb fingers 18,20 at those regions where the gap spacing between adjacent comb fingers 18,20 is greater than the smallest gap 32. In addition, an increased amount of lateral etching typically occurs across the end portions 26 of each comb fingers 18,20, causing the end portions 26 to have a non-uniform profile.

Figure 2:
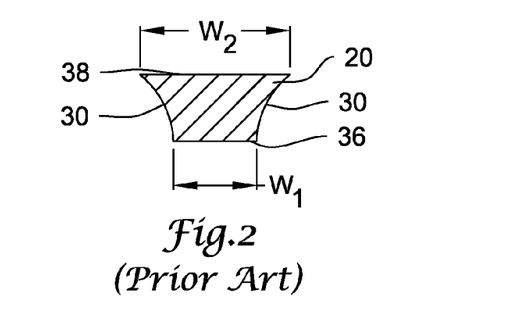
FIG. 2 is a cross-sectional view showing the profile of one of the comb fingers along line 2-2 in FIG. 1.

FIG. 2 is a transverse cross-sectional view showing the profile of one of the comb fingers 20 along line 2-2 in FIG. 1. As shown in FIG. 2, the vertical etch profile of the comb finger 20 tends to be asymmetric, with a greater amount of etching occurring along the sides 30 towards the bottom surface 36 of the comb finger 20 than at the top surface 38 thereof. As a result, the width $W_1$ at the bottom surface 36 of the comb finger 20 tends to be smaller than the width $W_2$ at the top surface 38. This undercutting of the comb finger 20 is due, in part, to the geometry and size of the trench. Higher DRIE etch rates remove more silicon during each etch cycle, both vertically and laterally, since the etch phase is somewhat isotropic. As a result, the profile of the comb fingers 18,20 tends to be more non-uniform along its length, having a generally greater undercut profile at those regions where there is no immediately adjacent structure to reduce the gap and thus the rate of etching.

During operation, a time-varying electrical signal is applied across the comb fingers 18,20, inducing an opposite charge along the length of each laterally adjacent comb finger 18,20. This time-varying charge generates a motive force that causes the comb fingers 18,20 to move back and forth with respect to each other. As the comb fingers 18,20 move with respect to each other, however, the non-uniform profile along the length of the comb fingers 18,20 induces a non-linear change in capacitance, causing electrical harmonic distortion to be introduced into the motor drive power. This introduction of harmonics into the drive power may increase the amount of energy required to electrostatically actuate the moving member at the desired frequency, and increase the complexity of the drive electronics necessary to control movement. In some circumstances, the non-uniform profile of the comb fingers 18,20 can cause quadrature, or motion out-of-plane, creating more noise in the sensor output.

Figure 3:
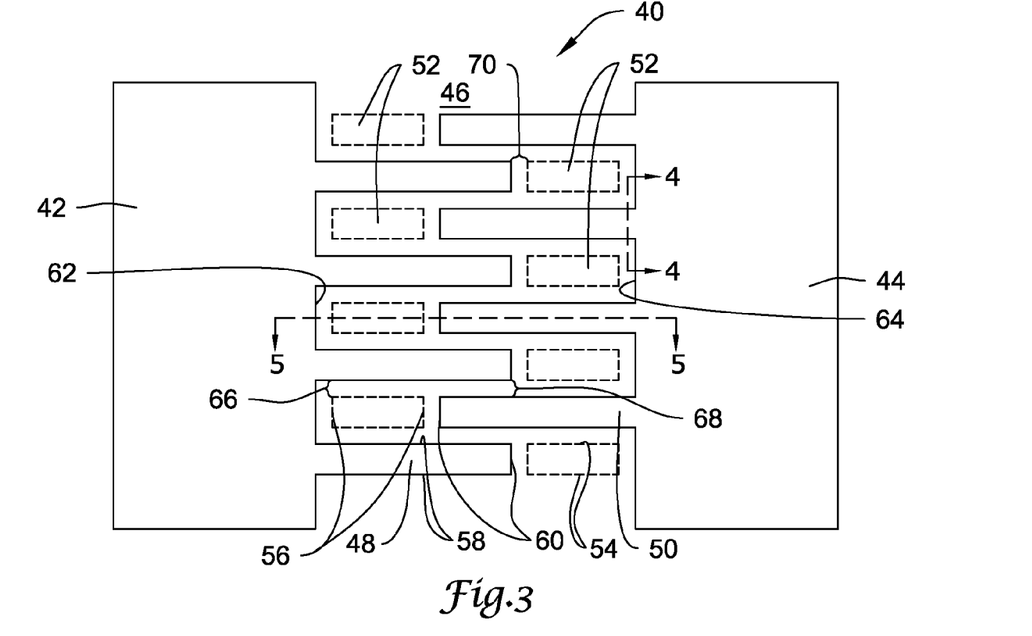
FIG. 3 is a schematic view of an electrostatic comb drive device in accordance with an illustrative embodiment of the present invention.

Referring now to FIG. 3, an electrostatic comb drive device 40 in accordance with an illustrative embodiment of the present invention is illustrated. Comb drive device 40, illustratively a linear-type comb drive device, includes a first comb drive member 42 and a second comb drive member 44, each formed in an opposing manner on top of an underlying support substrate 46. The first comb drive member 42 can include a number of comb fingers 48 interdigitated with a number of comb fingers 50 which are coupled to the second comb drive member 44. Although not shown in FIG. 3, a suspended spring may also be provided to produce a restoring force when the drive voltage passes through zero, similar to that described above.

The comb fingers 48,50 can be configured to operate in a manner similar to the comb fingers 18,20 described above. In certain embodiments, for example, a square wave, sinusoidal wave, or any other suitable time-varying AC voltage signal can be applied to the comb fingers 48,50, causing the comb fingers 48,50 to move back and forth with respect to each other in a desired manner above the underlying support substrate 46. While a linear-type comb drive device is specifically illustrated in FIG. 3, it should be understood that the comb drive members 42,44 and associated comb fingers 48,50 can be configured to move in some other desired fashion. For example, the comb drive device 40 may comprise a rotary-type comb drive device having a configuration similar to that described in PCT International Application Number PCT/US01/26775, which is incorporated herein by reference in its entirety.

To reduce harmonic distortion caused by non-uniformities in the profile of the comb fingers 48,50, comb drive device 40 may be formed using one or more sacrificial etch-buffers. In the schematic view depicted in FIG. 3, for example, a number of sacrificial etch-buffers 52 are shown at selective locations adjacent to the comb fingers 48,50. As is discussed in greater detail below with respect to FIGS. 6A-6H, these etch-buffers 52 can be used during the fabrication process to minimize the relatively larger gaps between adjacent structures that can cause non-uniformities in the profile of the comb fingers 48,50. As indicated by dashed lines, the sacrificial etch-buffers 52 are later removed in a etch-buffer removal process, leaving intact a structure similar to that discussed above with respect to FIG. 1.

In the illustrative embodiment, the sacrificial etch-buffers 52 may have a substantially rectangular shape defining first and second opposing sides 54, and first and second opposing ends 56. The specific dimensions of the sacrificial etch-buffers 52 employed can vary depending on the dimensions and relative spacing of the comb drive fingers 48,50, and the distance between the comb fingers 48,50 and other adjacent structures such as the leading ends 62,64 of each comb drive member 42,44. The sacrificial etch-buffers 52 may be placed within the non-overlapping regions of the comb fingers 48,50, and can be dimensioned such that the first and second opposing sides 54 of the sacrificial etch-buffer 52 are substantially parallel and adjacent with the sides 58 of each laterally adjacent comb finger 48,50.

A first narrowed gap 66 formed between one or both sides 54 of the sacrificial etch-buffers 52 can be utilized to match the etch rate along the sides 58 of the comb fingers 48,50 where no finger overlap exists. To provide a more uniform profile along the length of the comb fingers 48,50, the first narrowed gap 66 may be made to approximate the fixed-width gap 68 that normally exists between the overlapping regions of the comb fingers 48,50. In certain embodiments, for example, the first narrowed gap 66 can have a width of approximately 1 to 2 microns, similar to the width at gap 68. It should be understood, however, that the first narrowed gap 66 is not necessarily limited to such dimension.

The sacrificial etch-buffers 52 can also be dimensioned to form a second narrowed gap 70 located between the ends 58 of the comb fingers 48,50 and the ends 56 of the sacrificial etch-buffers 52. The second narrowed gap 70 can be made to approximate the gap 68 that exists between overlapping regions of the comb fingers 48,50. In certain embodiments, for example, the second narrowed gap 70 can have a width of approximately 1 to 2 microns, similar to the width at gap 68. As with the first narrowed gap 66, the second narrowed gap 70 reduces the differential rate of etching that can occur across the ends 60 of the comb fingers 48,50.

Figure 4:
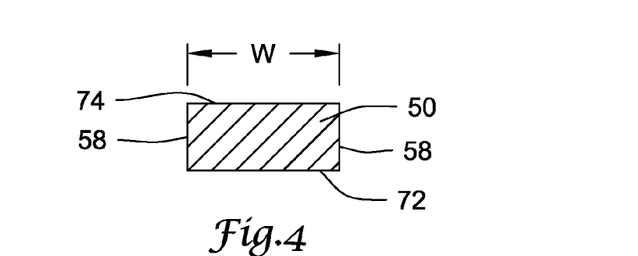
FIG. 4 is a transverse cross-sectional view of one of the comb fingers along line 4-4 in FIG. 3.

FIG. 4 is a transverse cross-sectional view of one of the comb fingers 50 along line 4-4 in FIG. 3. As shown in FIG. 4, the profile of the comb finger 50 is substantially symmetric, with an equal amount of etching occurring at the bottom surface 72 of the comb finger 50 as at the top surface 74. By employing sacrificial etch-buffers 52 adjacent to the sides 56 of the comb fingers 48,50, the effects of undercutting may be reduced and/or eliminated. As a result, the sides 56 of the etched comb fingers 48,50 tend to be substantially vertical in orientation, with a more uniform width W across the entire thickness of the comb finger 50.

Figure 5:
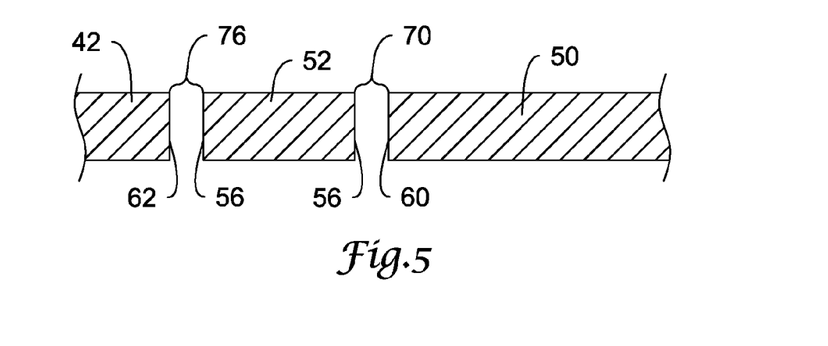
FIG. 5 is a longitudinal cross-sectional view of one of the comb fingers and sacrificial etch-buffers along line 5-5 in FIG. 3.

FIG. 5 is a longitudinal cross-sectional view showing the profile of one of the comb drive fingers 50 and sacrificial etch-buffers 52 along line 5-5 in FIG. 3. As shown in FIG. 5, the sacrificial etch-buffer 52 can be positioned laterally adjacent and in-line with the comb finger 50 and leading end 62 of the first comb drive member 42. One end 56 of the sacrificial etch-buffer 52 can be spaced apart a distance from the end 60 of the comb finger 50, forming the second narrowed gap 70 discussed above. A similarly dimensioned third narrowed gap 76 disposed between the leading end 60 of the first comb drive member 42 and the opposite end 56 of the sacrificial etch-buffer 52 may also be provided to match the etch rate along the leading ends 60,62 of the comb drive member 42, if desired.

In certain embodiments, the second and third narrowed gaps 70,76 formed by the sacrificial etch-buffer 52 can be made to approximate the gap 68 disposed between adjacent sides 58 of the comb fingers 48,50. In one illustrative embodiment, for example the second and third narrowed gaps 70,76 may have a width of approximately 1 to 2 microns, similar to the width provided at gap 68. By providing a constant gap width at these locations, the etch rate at the ends 60 of the comb fingers 48,50 and at the leading ends 62,64 of the comb drive members 42,44 can be further controlled.

While the illustrative embodiment shown in FIGS. 3-5 depicts etch-buffers having a substantially rectangular shape along their length, it should be appreciated that the etch-buffers can assume other desired shapes depending on the particular type of comb drive device employed. In a rotary-type comb drive device utilizing curved comb fingers, for example, the sacrificial etch-buffers can be made to assume a curved shape along one or more of its sides to provide a uniform gap along the length of the comb fingers. As with other embodiments herein, the sacrificial etch-buffers can be used to match the etch rate at those regions where there is no immediately adjacent structure, resulting in less undercutting of the comb fingers.

Operation of the comb drive device 40 is similar to that discussed above with respect to the aforesaid prior art electrostatic comb drive device 10. A time-varying electrical signal can be applied to the comb fingers 48,50, inducing the opposite charge along the length of each laterally adjacent comb finger that moves the comb fingers 48,50 toward each other. The electrical signal can be varied to oscillate the comb fingers 48,50 back and forth relative to one another in a desired manner. In certain embodiments, for example, an external AC voltage configured to output a square wave voltage signal can be utilized to reciprocate the comb fingers 48,50 back and forth relative to each other. In other embodiments, a sinusoidal wave may be used.

FIGS. 6A-6H are schematic representations of an illustrative method of fabricating a comb drive device using one or more sacrificial etch-buffers. These drawings show one comb finger 112, one etch-buffer 108, and one comb anchor 110 for clarity. It is implied that the cross-sections in 6A-6H represent a comb drive similar to FIG. 3. Beginning with FIG. 6A, a wafer 78 having a first surface 80 and a second surface 82 is provided as a sacrificial substrate, which is later removed through an etching process. The wafer 78 can be formed from any number of suitable materials capable of being etched using semiconductor fabrication techniques such as micromasking. While silicon is typically the most common wafer material used, it will be appreciated by those of skill in the art that other suitable materials such as gallium, arsenide, germanium, glass, or the like can also be used, if desired.

Figure 6A:
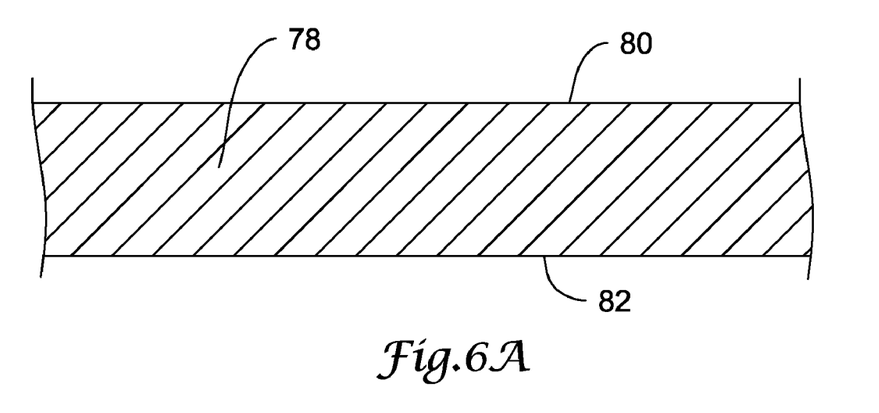
FIGS. 6A-6H are schematic representations of an illustrative method of fabricating a comb drive device utilizing one or more sacrificial etch-buffers.
Figure 6B:
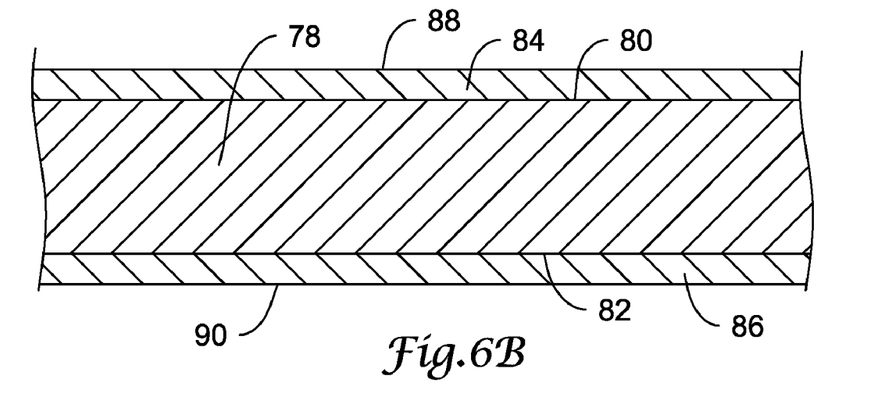

As shown in a second step in FIG. 6B, a layer 84 of boron-doped silicon can be grown or formed on the first surface 80 of the wafer 78. In some embodiments, for example, building of the epitaxial layer 84 includes an epitaxially grown single-crystal silicon layer that is heavily doped with boron. Other dopants such as indium, thallium, and aluminum may also be used to form the epitaxial layer 84, if desired. In use, the dopant (e.g. boron) contained in the grown or formed epitaxial layer 84 can be used as an etch stop in later fabrication steps to facilitate removal of the wafer 78, leaving only the relatively thin epitaxial layer 84 to form the various comb drive elements of the comb drive device.

In some cases, the relatively high concentration of dopant within the first epitaxial layer 84 can cause intrinsic tensile stresses within the wafer 78. These intrinsic tensile stresses can cause the wafer 78 to bow or cup enough to make processing of the wafer impractical. To minimize wafer bowing caused by the growth of the epitaxial layer 84 on only one side of the wafer 78, and in an illustrative embodiment, a second epitaxial layer 86 can be grown or formed on the second surface 82 of the wafer 78 to counterbalance the stresses imparted to the wafer 78 by the first epitaxial layer 84. As shown in FIG. 6B, the resulting wafer 78 substrate is sandwiched between opposing layers 84,86 of boron-doped silicon, forming a bottom side 90 and a top side 88 of the wafer 78.

Figure 6C:
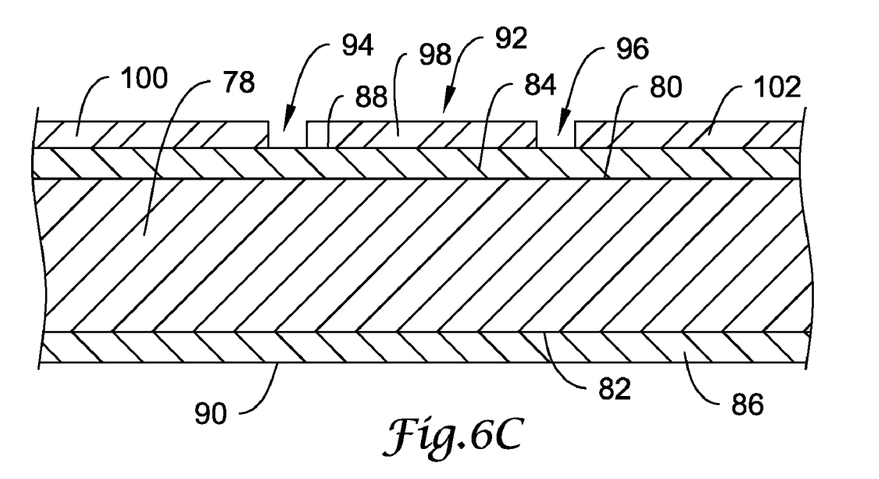

FIG. 6C illustrates another fabrication step involving the use of a photomask cap layer 92 on the top side 88 of the first epitaxial layer 84. The cap layer 92 can be patterned using a suitable process such as photolithography to form the desired elements of the comb drive device, as well as other desired components. A number of channels 94,96 exposing the top side 88 of the first epitaxial layer 84 to the surrounding environment allow an etchant to flow downwardly through the first epitaxial layer 84 and onto the first surface 80 of the wafer 78.

In the particular view depicted in FIG. 6C, the cap layer 92 includes a first mask region 98 that can be used to define one of the sacrificial etch-buffers depicted, for example, in FIG. 3. The first masked region 98 can be spaced apart from a second and third mask region 100,102 of the cap layer 92, which can be used, for example, in defining the structure of each of the comb fingers 48,50 illustrated in FIG. 3.

Figure 6D:
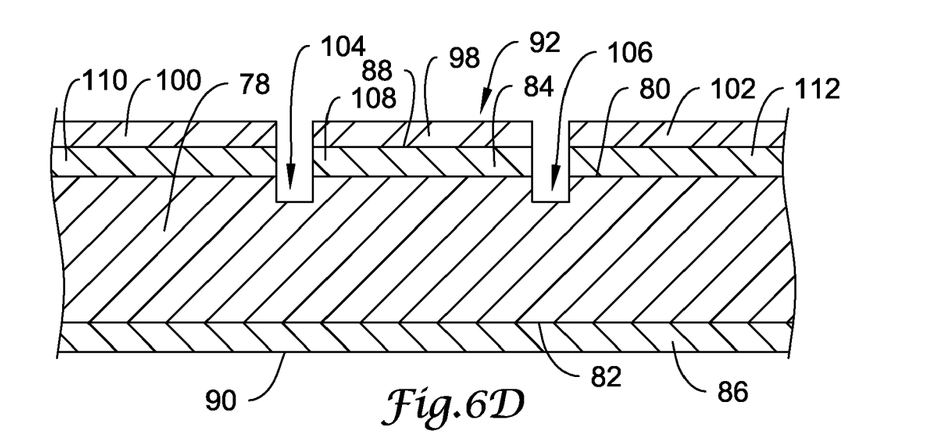

FIG. 6D illustrates the step of etching the first epitaxial layer 84 and wafer substrate 78 to define the comb drive elements and etch-buffers of the comb drive device. Using a suitable etching process such as Deep Reactive Ion Etching (DRIE), which relies on the gas composition in the surrounding atmosphere and applied RF power, a number of trenches 104,106 can be formed through the first epitaxial layer 84 and, in some cases, into the top surface 80 of the wafer 78. During the etching process, the existence of the first mask region 98 above the first epitaxial layer 84 prevents the removal of material immediately below the cap layer 92, forming an etch-buffer 108. In similar fashion, the second and third mask regions 100,102 prevent the removal of material below the cap layer 92, forming a number of comb fingers 112, and comb anchors 110, spaced apart from the etch-buffer by the trenches 104,106.

Because the etchant is typically optimized for the gap or spacing between adjacent fingers 48,50, as the etchant travels through the channels 94,96 (FIG. 6C) to form the trenches 104,106, the existence of the etch-buffer 108 matches the width of the trench, and helps ensure that the consumption of reactant species used in the DRIE process is substantially uniform. As a result, the vertical etch profile of the trenches 104,106 is substantially linear, with an equal amount of etching occurring at the top of the trench 104,106 as at the bottom. Once the trenches 104,106 have been formed, the cap layer 92 is stripped off in a manner leaving the etched first epitaxial layer 84 and wafer 78 intact for further processing.

In some cases, the relatively small etch-buffers that are placed between adjacent fingers of the comb drive structure may be difficult to remove during final wafer dissolution. Tests conducted without removing the relatively small comb etch-buffers prior to wafer bonding showed that they can become stuck in areas of the finished device, where they are difficult, and in some cases, virtually impossible to remove. This issue generally does not affect larger etch-buffers because they are too big to easily become trapped or lodged. Trapped etch-buffers can cause a substantial yield loss. Therefore, and in accordance with some embodiments of the present invention, the relatively small comb etch-buffers may be removed before wafer bonding, but this is not required.

Figure 6E:
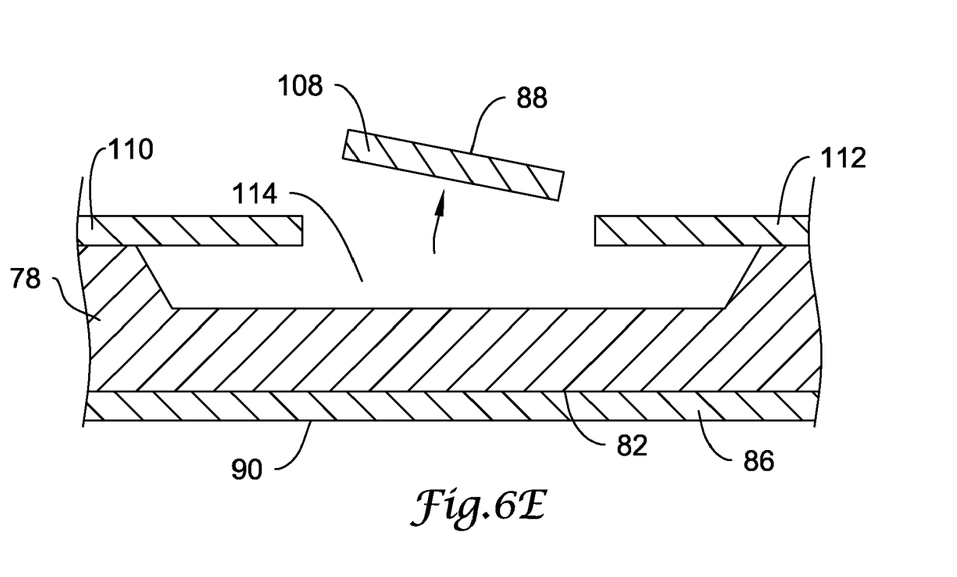

FIG. 6E illustrates the optional step of removing the relatively small etch-buffers 108 from the comb drive portion of the device prior to wafer bonding. A selective etchant, such as the anisotropic, ethylenediamine-based etchant PSE 300-S (EDP-S) available from the Transene Company, of Danvers, Mass. can be used at the lower end of the temperature range (i.e. at about 100° C.) for a suitable period (e.g. 20 minutes) to completely undercut the relatively small etch-buffers, forming a shallow cavity 114 under the etch-buffers 108, and causing them to be free to float away. During this process the comb fingers 112 may also be completely undercut, but because they are attached to larger features (42,44 of FIG. 3), they remain intact. While EDP is used in the illustrative embodiment, it should be understood that any suitable selective etching procedure may be used to undercut and liberate the relatively small etch-buffers.

In most cases, not all of the relatively small etch-buffers 108 will completely disengage from their position on the silicon wafer during the EDP etch process. Thus, at least in these cases, further removal-enhancing steps may be desirable. Rinsing, such as overflow rinsing with de-ionized water (DI H2O), which is used to remove EDP residue, will remove some of the liberated etch-buffers 108. But complete removal may require a more aggressive cleaning process in most cases.

Figure 6F:
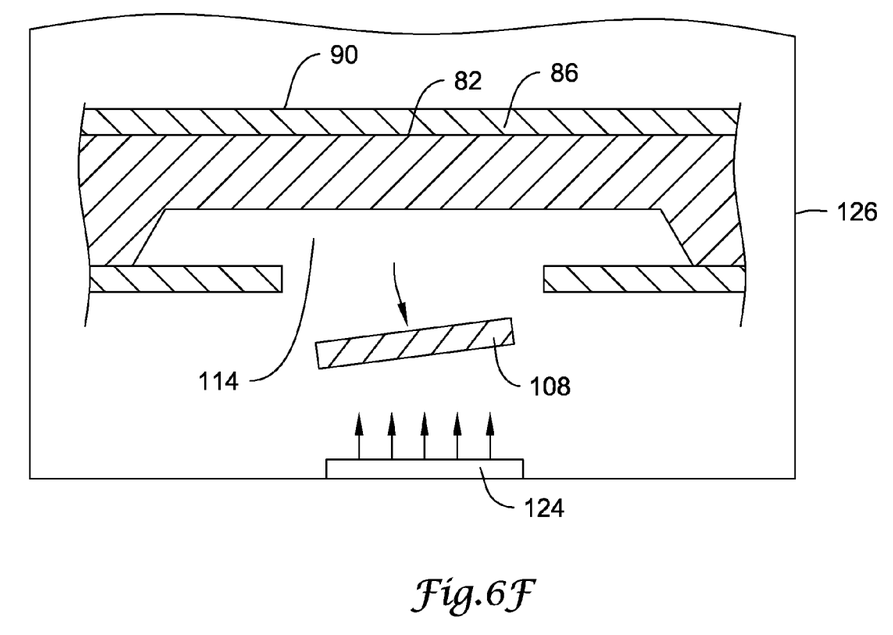

In one illustrative removal step depicted in FIG. 6F, for example, an acoustical cleaning process may be used to help liberated the etch-buffers 108 from the surrounding structure. In the illustrative embodiment, the formed comb drive device structure can be submersed within a bath 126 containing a suitable fluid such as de-ionized (DI) water. An acoustical source 124 (e.g. a piezoelectric transducer) capable of producing acoustical pressure waves can be activated within the bath 126 to acoustically clean the various structures of the comb drive device. As shown in FIG. 6F, for example, the acoustical energy emitted from the transducer 124 can be used to agitate the fluid surrounding the etch-buffers 108, causing the etch-buffers 108 to float away into the surrounding fluid. A DI water rinse and dry cycle may follow the cleaning step, if desired.

In certain embodiments, the acoustical source 124 can be configured to clean the structure and/or help liberate the etch-buffers 108 using a megasonic cleaning process, which utilizes relatively low energy sonic pressure waves in the range of about 400 kHz to 1.2 MHz. Similar to other cleaning techniques such as ultrasonic cleaning, megasonic cleaning relies on the principal of acoustical cavitation. In contrast to ultrasonic cleaning, however, megasonic cleaning produces significantly smaller bubbles, resulting in a lower release of energy at implosion, causing little or no damage to a surface subjected to this process. In some embodiments, a solution of Summaclean SC-15 containing a number of surfactant additives can be added to the bath 126 to aid in the removal of, and limit redeposition of the etch-buffers 108 within the structure. While megasonic cleaning is generally preferred for its ability to gently clean the structure, it should be understood that other suitable cleaning processes could be utilized, if desired.

Figure 6G:
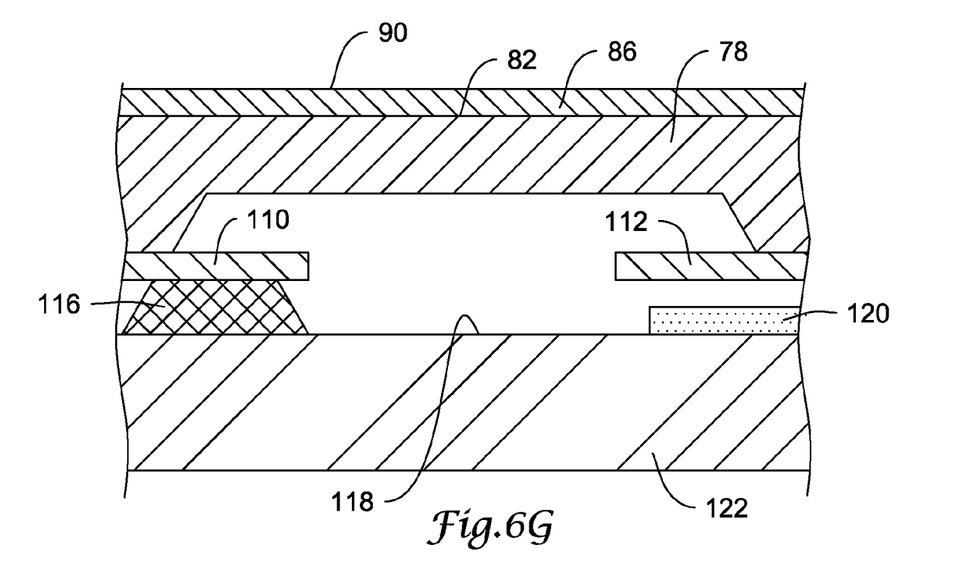

FIG. 6G illustrates the step of bonding the etched wafer 78 of FIG. 6D to an underlying support substrate 122. In some illustrative embodiments, the underlying support substrate 122 can be formed from a suitable dielectric material that can be used to electrically isolate the various components of the comb drive device. In certain embodiments, for example, the underlying support substrate 122 may be formed of suitable glass material such as Pyrex® Corning Type No. 7740.

One or more metallic electrodes 120 and conductive traces (not shown) disposed above a top surface 118 of the underlying support substrate 122 can be used to provide electrical connections to the various sensing elements of the comb drive device. The metallic electrodes 122 may be formed using techniques well known to those skilled in the art. In certain embodiments, for example, the metallic electrodes 122 may be formed by sputtering or evaporating metallic particles (e.g. titanium, platinum, gold etc.) onto the top surface 118 using a suitable sputtering or evaporation processes, and photolithography and etch or lift-off techniques.

The underlying support substrate 122 may further include one or more mesas 116 extending upwardly from the top surface 118. The mesas 116 can be formed by etching away a portion of the top surface 118 of the underlying support substrate 122, leaving intact the material at the mesas 116. Alternatively, the mesas 116 can be formed by building up material from the top surface 118. In either embodiment, the mesas 116 can be configured to support the comb drive members above the top surface 118 in a manner that permits freedom of movement.

Once the electrodes, conductive traces, supports and other desired elements have been formed on the underlying support substrate 122, the etched wafer 78 depicted generally in FIG. 6E is then flipped or inverted such that the topside 88 of the etched wafer 78 is positioned on top of the mesas 116 so as to overhang the top surface 118 of the underlying support substrate 122. The etched wafer 78 and underlying support substrate 122 are then bonded together using a suitable bonding process such as anodic bonding, wherein the two substrates are heated at an elevated temperature (e.g. 200-500° C.) and then chemically bonded together by applying a charge to the two members. Other suitable bonding processes such as heat bonding, adhesives, etc. may also be used to bond the two members together, if desired.

Figure 6H:
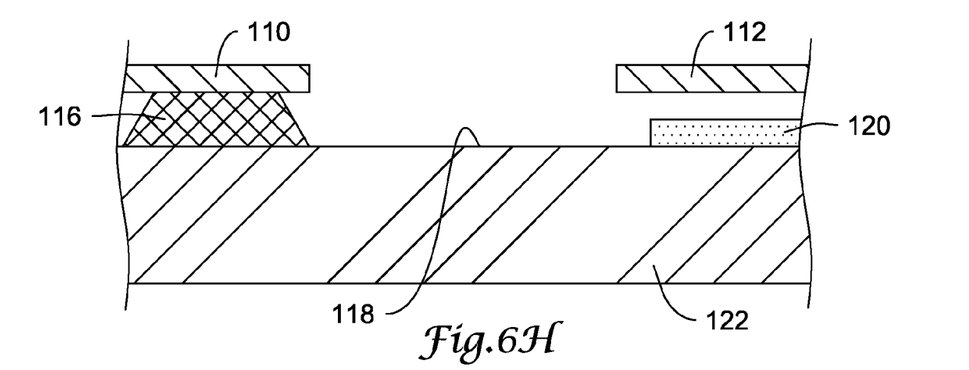

FIG. 6H illustrates the final steps that can be used to fabricate the comb drive device. As illustrated in FIG. 6H, the second epitaxial layer 86 and the remaining portions of the etched wafer 78 are removed, leaving intact the heavily boron-doped microstructures overhanging the top surface 118 of the underlying support substrate 122. The removal of the wafer 78 can be accomplished by using a combination of non-selective processes such as wafer grinding or KOH-based etching, and selective processes which will not attack or significantly attack the highly boron doped silicon. In certain embodiments, for example, the second epitaxial layer and most of the substrate 78 can be removed using an industry standard grinding process, leaving enough of the substrate 78 to not hit the patterned epitaxial layer. The remaining silicon can then be selectively removed using an anisotropic, ethylenediamine-based etchant such as PSE 300-F available from the Transene Company, of Danvers, Mass. for a suitable time to remove any remaining material. It should be understood, however, that any number of suitable doping-selective etching procedures could be used to remove the remaining wafer material.

In some cases not all of the remaining etch-buffers (such as larger etch-buffers) will completely disengage from their position on the bonded wafer during the etch process and further removal-enhancing steps may be desirable. Rinsing, such as overflow rinsing with de-ionized water (DI H2O), which is used to remove EDP residue will remove some of any liberated etch-buffers. But complete removal may require a more aggressive cleaning process in some cases.

In one illustrative removal step similar to that depicted in FIG. 6F, for example, an acoustical cleaning process can be used to help remove the liberated etch-buffers from the surrounding structure. The bonded comb drive device structure can be submersed within a bath 126 containing a suitable fluid such as de-ionized (DI) water. An acoustical source 124 (e.g. a piezoelectric transducer) capable of producing acoustical pressure waves can be activated within the bath 126 to acoustically clean the various structures of the comb drive device. As shown in FIG. 6F, for example, the acoustical energy emitted from the transducer 124 can be used to agitate the fluid surrounding the etch-buffers, causing the etch-buffers to float away into the surrounding fluid. A DI water rinse and dry cycle may follow the cleaning step, if desired.

In certain embodiments, the acoustical source 124 can be configured to clean the structure using a megasonic cleaning process, which utilizes relatively low energy, sonic pressure waves in the range of about 400 kHz to 1.2 MHz. Similar to other cleaning techniques such as ultrasonic cleaning, megasonic cleaning relies on the principal of acoustical cavitation. In contrast to ultrasonic cleaning, however, megasonic cleaning produces significantly smaller bubbles, resulting in a lower release of energy at implosion, causing little or no damage to a surface subjected to this process. In some embodiments, a solution of Summaclean SC-15 containing a number of surfactant additives can be added to the bath 126 to aid in the removal of, and limit redeposition of the etch-buffers similar to 108 within the structure. While megasonic cleaning is generally preferred for its ability to gently clean the structure, it should be understood that other suitable cleaning processes could be utilized, if desired.

When the relatively small etch-buffers are not removed before wafer bonding, the final backside etching process will liberate the relatively small etch-buffers, along with any larger etch-buffers if present. As described above, a combination of rinsing and cleaning may be used to help remove these etch-buffers from the resulting structure, if desired.

Having thus described the several embodiments of the present invention, those of skill in the art will readily appreciate that other embodiments may be made and used which fall within the scope of the claims attached hereto. Numerous advantages of the invention covered by this document have been set forth in the foregoing description. It will be understood that this disclosure is, in many respects, only illustrative. Changes may be made in details, particularly in matters of shape, size and arrangement of parts without exceeding the scope of the invention.

The invention claimed is:

1. A method of fabricating a comb drive device utilizing one or more sacrificial etch-buffers, comprising the steps of: providing a substrate; and etching a pattern into the substrate to form one or more interdigitated comb fingers having overlapping and non-overlapping regions, the pattern also including one or more etch-buffers in at least one non-overlapping region.

2. A method of fabricating a comb drive device utilizing one or more sacrificial etch-buffers, comprising the steps of: providing a wafer substrate having a first surface and a second surface; applying a first epitaxial layer onto the first surface of the wafer substrate; etching a pattern into the first epitaxial layer and at least a portion of the wafer substrate to form one or more comb drive structures with one or more sacrificial etch-buffers therebetween; liberating one or more of the sacrificial etch-buffers from the comb drive structure with a selective etch; bonding the etched wafer substrate to an underlying support substrate; and etching away the wafer substrate.

3. The method of claim 2, wherein the sacrificial etch-buffers are liberated using an EDP etchant.

4. The method of claim 3, wherein said step of liberating the one or more sacrificial etch-buffers also includes an acoustical cleaning process.

5. The method of claim 3, wherein said step of liberating the one or more sacrificial etch-buffers also includes a megasonic cleaning process.

6. The method of claim 3, further comprising the step of applying a second epitaxial layer onto the second surface of the wafer substrate prior to said step of etching a pattern into the first epitaxial layer and at least a portion of the wafer substrate.

7. The method of claim 3, wherein said step of bonding the etched wafer substrate to an underlying support substrate is performed by an anodic bonding process.

8. The method of claim 3, further comprising the step of forming one or more mesas on a top surface of the underlying support substrate, said one or more mesas adapted to freely support the etched comb drive structures thereabove.

9. The method of claim 3, wherein said step of etching a pattern into the first epitaxial layer and at least a portion of the wafer substrate includes the step of applying a cap layer onto the a top side of the first epitaxial layer, said cap layer defining a pattern of microstructures including at least one sacrificial etch-buffer.

10. The method of claim 3, wherein said step of etching the first epitaxial layer and at least a portion of the wafer substrate includes a deep reactive ion etch (DRIE) process.

11. The method of claim 3, wherein said step of etching the first epitaxial layer and at least a portion of the wafer substrate is performed using photolithography.

12. The method of claim 2, wherein each of said one or more sacrificial etch-buffers is configured to provide a uniform gap width between adjacent comb drive structures.

13. A method of fabricating a comb drive device utilizing one or more sacrificial etch-buffers, comprising the steps of: providing a wafer substrate having a first surface and a second surface; applying a first epitaxial layer onto the first surface of the wafer substrate; applying a cap layer onto the first epitaxial layer, said cap layer defining a pattern of a microstructure including at least one sacrificial etch-buffer; etching the first epitaxial layer and at least a portion of the wafer substrate to form the microstructure with one or more sacrificial etch-buffers; removing the cap layer from the first epitaxial layer; liberating one or more of the sacrificial etch-buffers from the microstructure with a selective etch process; bonding the etched wafer substrate to an underlying support substrate; and etching away the wafer substrate.

14. The method of claim 13, wherein said step of liberating one or more of the sacrificial etch-buffers also includes an acoustical cleaning process.

15. The method of claim 13, wherein said step of liberating the one or more sacrificial etch-buffers also includes a megasonic cleaning process.

16. The method of claim 13, further comprising the step of applying a second epitaxial layer onto the second surface of the wafer substrate prior to said step of etching a pattern into the first epitaxial layer and at least a portion of the wafer substrate.

17. The method of claim 13, wherein said step of bonding the etched wafer substrate to an underlying support substrate is performed by an anodic bonding process.

18. The method of claim 13, further comprising the step of forming one or more mesas on a top surface of the underlying support substrate, said one or more mesas adapted to freely support the etched microstructure thereabove.

19. The method of claim 13, wherein said microstructure includes one or more comb drive structures, and wherein at least one of said one or more sacrificial etch-buffers is configured to provide a uniform gap width between adjacent comb drive structures.

20. A method of fabricating a comb drive device utilizing one or more sacrificial etch-buffers, comprising the steps of: providing a wafer substrate having a first surface and a second surface; applying a first epitaxial layer onto the first surface of the wafer substrate; etching a pattern into the first epitaxial layer and at least a portion of the wafer substrate to form one or more comb drive structures with one or more sacrificial etch-buffers therebetween; liberating one or more of the sacrificial etch-buffers from the comb drive structure with a selective etch process; acoustically removing the liberated etch-buffers; bonding the etched wafer substrate to an underlying support substrate; etching away the wafer substrate; and acoustically removing one or more of the liberated etch-buffers, if any.

21. A method of fabricating a comb drive device utilizing one or more sacrificial etch-buffers, comprising the steps of: providing a wafer substrate having a first surface and a second surface; applying a first epitaxial layer onto the first surface of the wafer substrate; applying a second epitaxial layer onto the second surface of the wafer substrate; etching a pattern into the first epitaxial layer and at least a portion of the wafer substrate to form one or more comb drive structures with one or more sacrificial etch-buffers therebetween; liberating one or more of the small sacrificial etch-buffers from the comb drive structure with a selective etch process; bonding the etched wafer substrate to an underlying support substrate; and etching away the wafer substrate.

22. A method of fabricating a comb drive device utilizing one or more sacrificial etch-buffers, comprising the steps of: providing a wafer substrate having a first surface and a second surface; applying a first epitaxial layer onto the first surface of the wafer substrate; etching a pattern into the first epitaxial layer and at least a portion of the wafer substrate to form one or more comb drive structures with one or more sacrificial etch-buffers therebetween; bonding the etched wafer substrate to an underlying support substrate; and etching away the wafer substrate, thereby liberating said one or more of the sacrificial etch-buffers from the wafer substrate.

* * * * *